United States Patent [19]

Flaherty

[11] 4,074,186

[45] Feb. 14, 1978

[54] CONDUCTIVITY MEASURING INSTRUMENT HAVING LINEARIZATION MEANS AND A DIGITAL READ-OUT

[75] Inventor: John J. Flaherty, Grove Village, Ill.

[73] Assignee: Magnaflux Corporation, Chicago, Ill.

[21] Appl. No.: 614,877

[22] Filed: Sept. 19, 1975

[51] Int. Cl.[2] .......................................... G01R 33/12
[52] U.S. Cl. .................................... 324/222; 324/62; 324/225
[58] Field of Search ...................... 324/34 R, 40, 62 R

[56] References Cited

U.S. PATENT DOCUMENTS

| 3,244,977 | 4/1966 | Folsom | 324/34 R |
| 3,255,405 | 6/1966 | French | 324/34 R |
| 3,444,460 | 5/1969 | Penney, Jr. | 324/34 R |
| 3,568,044 | 3/1971 | Elazar | 324/62 R |
| 3,936,734 | 2/1976 | Brandli et al. | 324/40 |

Primary Examiner—Robert J. Corcoran

Attorney, Agent, or Firm—Brezina & Lund

[57] ABSTRACT

Conductivity measuring instruments are provided in which a test coil is supplied with alternating current and a detector responds to the voltage across the test coil to develop an analog voltage which is applied to a linearization circuit to develop an output voltage as a linear function of conductivity, the output voltage being applied to a digital read-out unit. As a function of conductivity, the analog voltage is single-valued, preferably with no more than a gradual slope change over a wide range of conductivity values. In one embodiment, a high impedance is provided in series with the test coil, the detector is a phase detector operated to respond primarily to the inductive component and linearization circuit is of a diode-function type. Alternatives are in the use of a phase-to-voltage type of detector and in the use of a digital type of detector and in the use of a digital type of linearization circuit.

7 Claims, 6 Drawing Figures

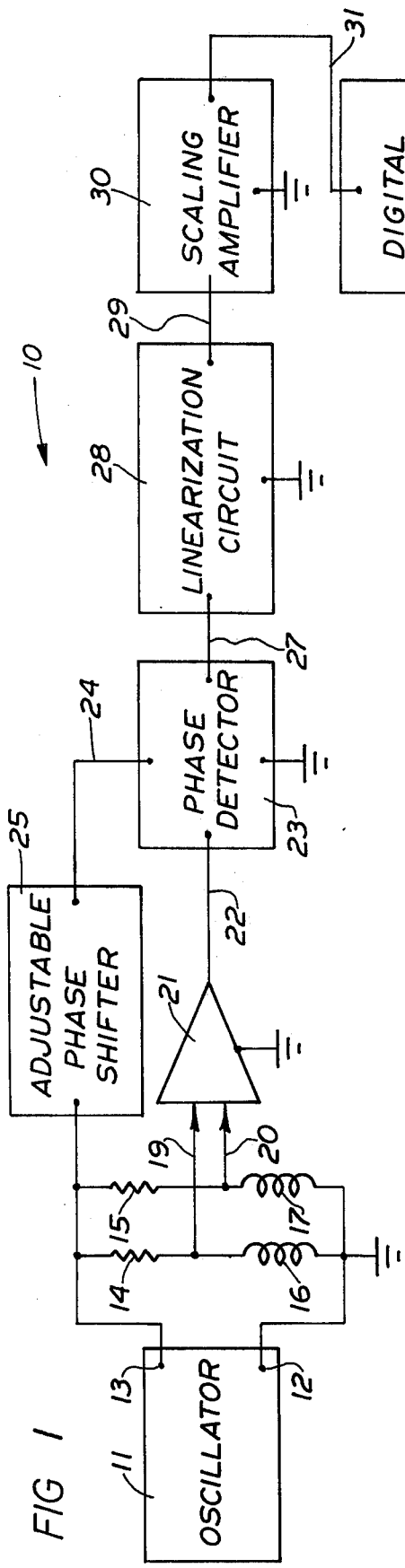
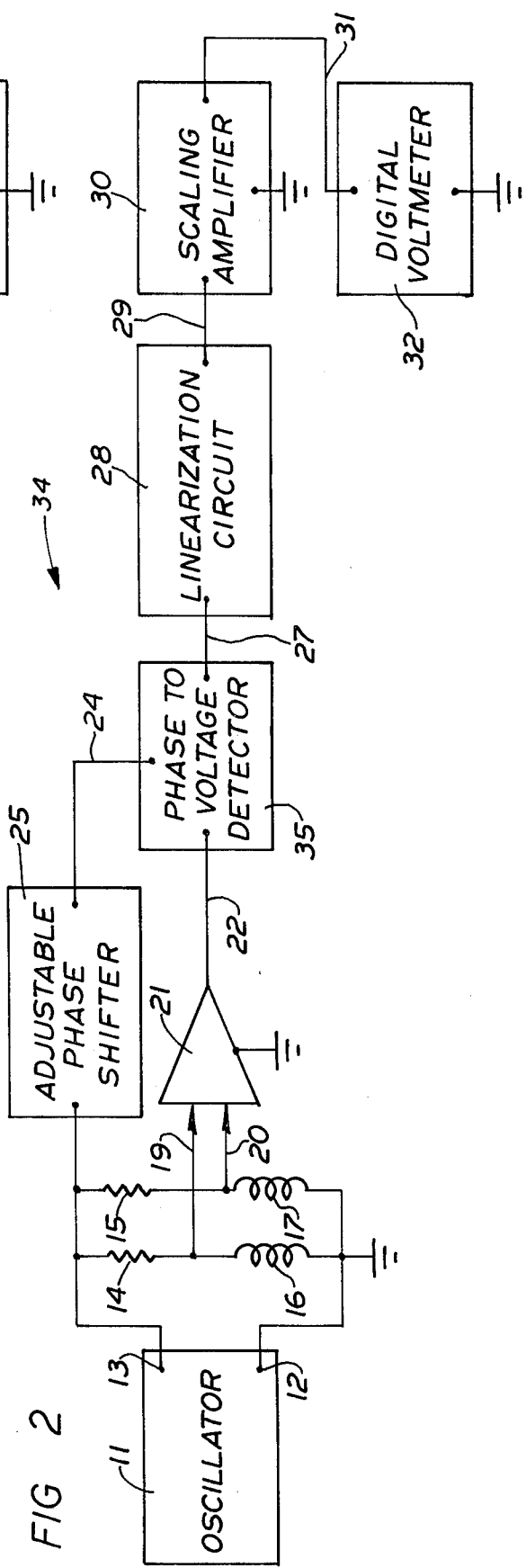

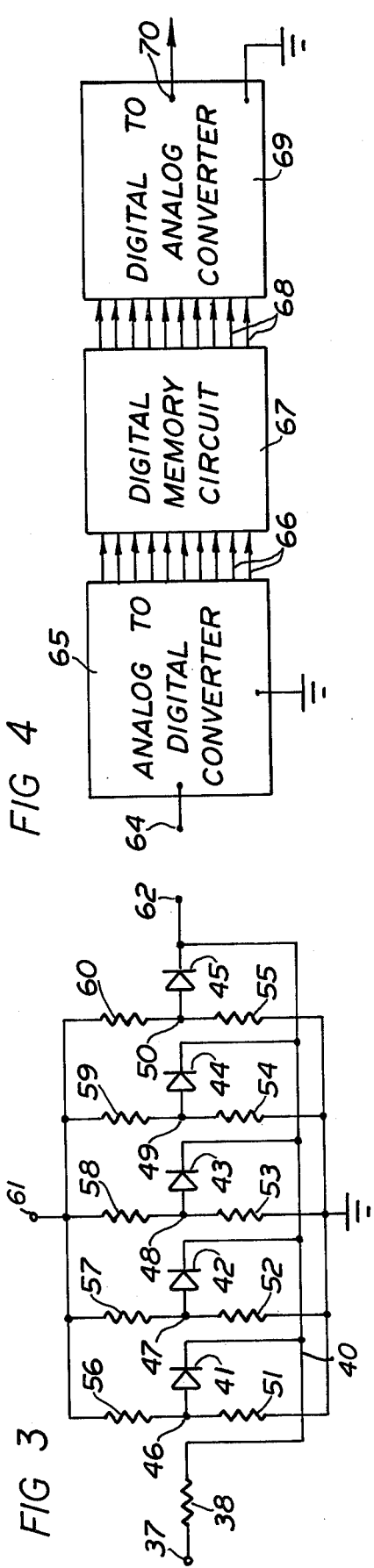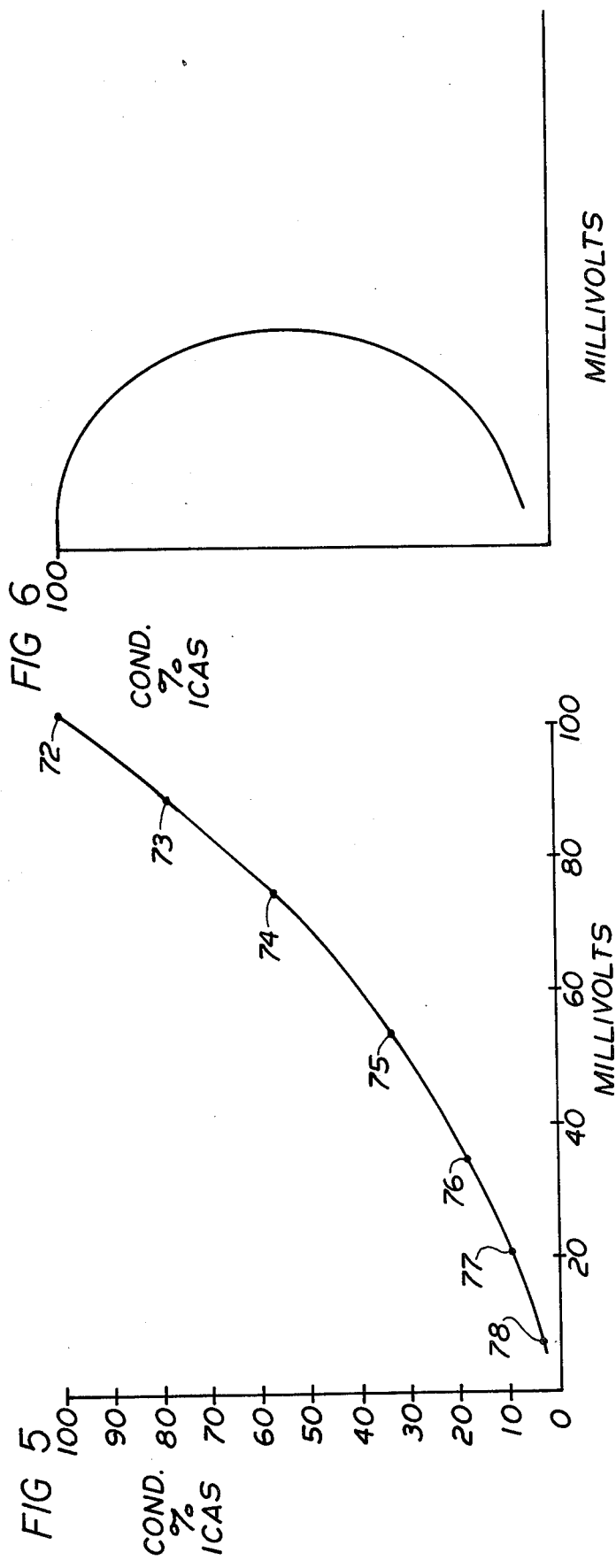

CONDUCTIVITY MEASURING INSTRUMENT HAVING LINEARIZATION MEANS AND A DIGITAL READ-OUT

BACKGROUND OF THE PRIOR ART

Conductivity measuring instruments conventionally use a test coil in a bridge circuit coupled to an AC source and to suitable detector means with a control being adjustable to operate an indicator to a null condition, conductivity being indicated on a scale showing the position of the control element. Such instructions require careful and time-consuming adjustments to obtain accurate measurements and rapid accurate measurements have not been possible. In addition, in requiring a null indicator, control element and scale, such instruments are generally quite large and bulky in construction.

SUMMARY OF THE INVENTION

This invention was evolved with the general object of providing conductivity measuring instruments with which highly accurate measurements can be rapidly made and recorded.

The invention relates in part to the recognition that disadvantages of prior conductivity measuring instruments might be overcome if an analog voltage could be developed as a linear function of conductivity to make possible the use of a digital readout arrangement and to permit measurements to be made rapidly, without requiring manual adjustment of a control element while observing a null indicator. In an investigation, an article was found in the Oct. 23, 1972 issue of Electronics, page 102, relating to the linearization of a bridge with a feedback circuit and it appeared that this approach might be promising. However, in attempting to write transfer function equations for several types of bridges used in eddy current conductivity meters, it was found that the bridge transfer functions were so complex that the approach would not be suitable. Even with a simple inductance-resistance bridge, it was found in analysis that a special term would have to be generated to cancel out certain terms in the general transfer of function and that the special term was difficult to synthesize, so that the bridge feedback linearization approach was discarded.

Thereafter, the need for a bridge was questioned and a study was made to determine whether a voltage could be developed across a test coil which would relate directly to coil impedance and it was observed that with an alternating current of constant magnitude flowing through a test coil, a voltage is developed across the test coil having resistive and inductive components. In plotting the resistive and inductive components as a function of percentage IACS conductivity at a large number of frequencies and for a number of coils, a certain pattern was observed. In particular, it was found that as a function of conductivity, the inductive component was single-valued whereas the resistive component was not. That is, any value of the inductive component corresponded to only one conductivity value, whereas a given value of the resistive component might be produced at two conductivity values. Stated in another way, the value of the inductive component changes progressively and continuously in one direction in response to a change in conductivity from a minimum value to a maximum value.

It was further found that the inductive component increased as conductivity increased and also that the nature of the curve was affected by frequency and probe coil constructions. For example, it was found that the lower the frequency, the straighter the curve. However, it was found that the inductive component was not a linear function of conductivity and, instead, had a generally parabolic shape increasing according to a power of the conductivity.

After making such determinations as to the relationships of the inductive and resistive components to conductivity, it was observed that although the inductive component was a non-linear function of conductivity, the function was such as to permit compensation with a suitable linearization circuit, so that the desired linear output could be obtained by using the combination of the generally constant current excitation of the test coil, a phase detector to separate out the inductive component of the voltage across the coil and a linearization circuit followingg the phase detector to compensate for the non-linear relationship between the inductive component and conductivity. Such a combination was then constructed, using a known diode-function linearization circuit, designed with a technique in which a function to be linearized is plotted and divided into a number of straight line segments which approximate the curve or the intersections of the straight line segments being breakpoint voltages. The required values of resistances were determined using a computer program. In testing the system, it was found that a very high degree of accuracy was obtained, within approximately one percent.

To obtain such accuracy, only slight adjustment was necessary, obtained by injecting a small amount of the resistive component by adjustment of the phase of the signal applied to the phase detector.

Such work and further study and analysis established the criteria essential or desirable for the practice of the invention. In accordance with the invention, a combination is provided including energizing and detector circuit means, connected to a test coil means to apply an alternating current thereto and to develop an analog signal having an amplitude varying according to a certain non-linear function of the conductivity of the part, and a linearization circuit responsive to the analog signal to develop an output signal having an amplitude varying as a linear function of the conductivity of the part, over a wide range of conductivity values.

It is very important that the analog signal as a function of conductivity be single-valued, i.e. that its amplitude should progressively and continuously change in one direction in response to changes in conductivity. If not, either inaccurate indications will be obtained or the range of conductivity values which can be measured will be limited. It is also very important that there be no abrupt changes or discontinuities in the relationship between the analog voltage and conductivity and preferably there should be no more than a gradual change in the slope of the analog voltage-conductivity curve, i.e. no more than a gradual change in the ratio of an incremental change in conductivity through the corresponding incremental change in the analog voltage. With this feature, the design and construction of the linearization circuit is simplified and a higher degree of accuracy and reliability can be obtained.

A specific feature of the invention is in the use of a linearization circuit comprising means for developing a plurality of components having different slope functions in relation to the analog signal and means for combining such components to produce the output voltage.

In one embodiment, each of the different slope functions is a linear function and the different slope functions are developed in progressive contiguous amplitude ranges of the analog voltage, preferably by using a plurality of resistance voltage divider circuits connected across a voltage source to provide different voltages respectively corresponding to breakpoints at intersections or junctions between the contiguous amplitude ranges and diodes or other uni-directional conduction means connected to the resistance-voltage divider circuits.

As an alternative, the linearization circuit comprises an analog-to-digital converter to develop first digital signals corresponding to the analog signal and a memory circuit for converting the first digital signals to second digital signals having a linear relationship to the conductivity of the part.

Another specific feature relates to the supply of a generally constant alternating current through the test coil means with detector means responsive to the voltage developed across the test coil means. The constant current may preferably be obtained by connecting a high impedance in series with the test coil means.

A further specific feature relates to the use of a phase detector to respond to the voltage across the test coil means and to develop the analog voltage, the phase detector being supplied with a reference AC voltage preferably with a phase such that the signal at the output of the phase detector is controlled primarily by the reactive component of the impedance of the test coil means.

As an alternative, phase-to-voltage detector means are provided responsive to a reference phase signal and to a signal derived from the test coil means to develop the analog voltage signal as a function of differences in phase between the reference phase signal and the signal from the test coil means.

This invention contemplates other objects, features and advantages which will become more fully apparent from the following detailed description taken in conjunction with the accompanying drawings.

BRIEF DESCRIPTION OF THE DRAWINGS

FIG. 1 is a schematic diagram of one preferred embodiment of a conductivity measuring instrument constructed in accordance with the invention;

FIG. 2 is a schematic diagram of another preferred embodiment of conductivity measuring instrument constructed in accordance with the invention;

FIG. 3 is a circuit diagram of one type of linearization circuit for the instruments of FIGS. 1 and 2; FIG. 4 is a schematic diagram of another form of linearization circuit for the instruments of FIGS. 1 and 2;

FIG. 5 is a graph illustrating the relationship of an inductive component with respect to conductivity under certain conditions; and FIG. 6 is a graph similar to FIG. 5 but illustrating the relationship of a resistive component to conductivity under similar conditions.

DESCRIPTION OF PREFERRED EMBODIMENTS

Referring to FIG. 1, reference numeral 10 generally designates one preferred embodiment of a conductivity measuring instrument constructed in accordance with the principals of the invention. The instrument 10 comprises an oscillator 11 having output terminals 12 and 13, terminal 12 being connected to ground and terminal 13 being connected through resistors 14 and 15 and coils 16 and 17 to ground. The coil 16 is a test coil which may be mounted in a probe structure in conventional fashion, for disposition against a surface portion of a part for measurement of the conductivity thereof. Coil 17 is a reference coil which may preferably have the same number of turns and be otherwise substantially identical to the test coil 16, and resistances 14 and 15 preferably have the same values so that when the test coil 16 is spaced a substantial distance from any part, the voltages developed across both coils are the same. It is also desirable, for reasons explained hereinafter, that the values of the resistances 14 and 15 be very large in relation to the impedances of the coils 16 and 17 so that alternating currents of substantially constant magnitudes flow through the coils 16 and 17 at all times.

The junction between resistors 14 and coil 16 and the junction between resistor 15 and coil 17 are connected through lines 19 and 20 to inputs of a differential amplifier 21 having an output connected through line 22 to one input of a phase detector 23. A second input of phase detector 23 is connected through line 24 to the output of an adjustable phase shifter 25 having an input connected to the output terminal 13 of the oscillator 11. The output of the phase detector 23 is connected through a line 27 to the input of a linearization circuit 28 having an output connected through line 29 to a scaling amplifier 30, having an output connected through a line 31 to the input of a digital voltmeter 32.

In operation, when both the test coil 16 and the reference coil 17 are in air, out of inductive relation to any part, the impedances thereof are substantially the same and no output is produced by the differential amplifier 21. When the test coil 16 is placed adjacent the surface of a part, its impedance is changed as a function of the conductivity of the part and there is a difference in the voltages developed across the coils 16 and 17, amplified by the differential amplifier 21 and applied to one input of the phase detector 23. The phase detector responds to a component of the difference voltage which has a specific phase relationship with the signal applied from the output of the adjustable phase shifter 25 and develops a corresponding analog voltage signal at its output, applied through line 27 to the input of the linearization circuit 28. Preferably, as discussed hereinafter, the phase of the signal applied from the phase shifter 25 is such that the analog voltage at the output of the phase detector 23 is controlled primarily by the inductive component of the difference in voltages across the coils 16 and 17.

The analog voltage so developed at the output of the phase detector 23 is preferably such as to progressively and continuously increase as a function of a change in conductivity of the part from a minimum value to a maximum value and is also preferably such that there are no abrupt discontinuities with no more than a gradual change in the slope of the function. However, the function is not linear and the linearization circuit 28 functions to correct for the non-linear character of the function, to develop an output voltage which is a linear function of conductivity, applied through scaling amplifier 30 to the digital voltmeter 32. It will be understood, of course, that the output of the scaling amplifier may be applied to indicating means other than a digital voltmeter or to suitable analog or digital recording instruments.

Referring to FIG. 2, reference numeral 34 generally designates a modified form of instrument constructed in accordance with the principles of the invention. The instrument 34 has components, which are the same as those of the instrument of FIG. 1, with the same reference numerals being applied, except that in place of the phase detector 23, a phase-to-voltage detector 35 is provided having one input connected through line 22 to the output of the differential amplifier 21, a second input connected through line 24 to the output of the adjustable phase shifter 25 and an output connected connected through the line 27 to the input of the linearization circuit 28. The operation is similar to that of the instrument 10. The phase-to-voltage detector 35 develops an output signal proportional to the difference in phase between the signal applied from the output of the differential amplifier 21, derived from the test coil 16, and a reference phase signal applied from the output of the phase shifter 25. With appropriate adjustment of the signal applied from the phase shifter 25, the phase-to-voltage detector 35 develops at its output an analog voltage which progressively and continuously changes as a function of a change in conductivity from a minimum value to a maximum value and with no more than a gradual change in the slope of the function. The linearization circuit 28 again functions to correct for non-linearities in the analog voltage signal at the output of the detector 35 and produces an output signal changing as a linear function of the conductivity of the part.

FIG. 3 is a circuit diagram of a type of circuit usuable as the linearization circuit 28 in the instruments of FIGS. 1 and 2. An input terminal 37, which may be connected to the line 27, is connected through a resistor 38 to a line 40 which is connected through diodes 41–45 to circuit points 46–50 connected through resistors 51–55 to ground and through resistors 56–60 to a terminal 61 which is connected to a suitable DC supply voltage source. The line 40 is connected to a terminal 62 forming an output terminal of the circuit and connectable through the line 29 to the input of the scaling amplifier. Preferably, the scaling amplifier has a very high input impedance so that the circuit can be regarded as operating into an infinite load impedance for simplification of design. The circuit operates in progressive contiguous amplitude ranges of the applied input voltage to provide a linear slope or response function in each range, the respective values of the slopes and the breakpoints or junction or intersection points being determined by the values of the resistors 51–60 and resistor 38 in relation to the DC supply voltage at terminal 61. It is noted that this type of circuit and methods of determining the values using computers are known in the art. It is also noted that this type of circuit is advantageous in the combination of the invention because it is relatively simple and inexpensive and, at the same time, with the energizing and detector means being so operated as to obtain a single-valued function with no more than gradual slope changes, a high degree of accuracy can be obtained with a relatively few number of stages in the linearization circuit.

FIG. 4 illustrates another type of circuit usable as the linearization circuit 28 of the instruments of FIGS. 1 and 2. An input terminal 64, connectable through line 27 to the output of the phase detector 23 or the phase-to-voltage detector 35 is connected to the input of an analog-to-digital converter 65 having outputs connected through lines 66 to inputs of a digital memory circuit 67. Outputs of the memory circuit 67 are connected through lines 68 to inputs of a digital-to-analog converter 69 having an output terminal 70 which may be connected to the input of the scaling amplifier 30 or directly to the digital voltmeter 32. After plotting the function of the output voltage of the detector 23 in FIG. 1 or the detector 35 in FIG. 2, appropriate values may be entered into the memory circuit 67 after which it operates as a read-only memory to produce signals according to a linear function of changes in conductivity.

FIG. 5 is a graph showing the relationship between conductivity as a percentage ICAS standard and the magnitude of the analog voltage at the output of the phase detector 23, with a particular type of probe and with the reference phase such as to measure the inductive component. The type of test coil used had an inductance of 1.539 millihenries, when operated in air out of inductive relation to any part and a resistance of 7.082 ohms under the same conditions. The coil had an "$n$" factor of 0.159 and a "$A_{eff}$" factor of 0.664, the "$n$" factor being indicative of the fraction of the total lines of magnetic force produced by the coil which pass through a part against which it is placed and the "$A_{eff}$" factor being the effective diameter of the coil, determined mainly by the actual diameter but influenced to some extent by the coil length. A frequency of 1KHz was used, and the actual values of output voltage obtained are indicated in FIG. 5.

FIG. 6 graphically illustrates the form of the relationship of conductivity to the resistive component, under the same conditions but with the reference phase signal adjusted to measure the resistive component. It will be noted that the inductive component curve of FIG. 5 is a single-valued curve, suitable for use in the system of this invention, whereas the resistance component curve of FIG. 6 is double valued and would not be suitable unless the conductivity range of testing were quite limited. It will be appreciated, of course, that a combination of resistance and inductive components might be used and in some circumstances, it may be desirable to inject a small amount of the resistive component to increase accuracy.

In connection with the type of coil used and the frequency of operation, it is noted that in general it is desirable to use a probe having a large effective diameter, i.e. a large "$A_{eff}$" factor, and also that the lower the frequency, the straighter the curve.

For design and construction of a linearization circuit for the test coil having characteristics as depicted in the graph of FIG. 5, and using the circuit arrangement of FIG. 3, points on the graph were selected, indicated by reference numerals 72–78, the curve being closely approximated by straight line segments interconnecting such points. With points as depicted, a computer was used to determine the following values for the resistors in the circuit of FIG. 3:

| Resistor | Value |
|---|---|
| 51 | 373,133 |
| 52 | 36,506.7 |
| 53 | 19,270.3 |
| 54 | 35,433.1 |
| 55 | 9,767.74 |
| 56 | 301,204 |
| 57 | 53,263.8 |
| 58 | 56,796.6 |
| 59 | 195,652 |
| 60 | 91,277.8 |

The resistor 38 has a value of 10,000 ohms. With resistors having approximately such values and with a final adjustment made by adjusting the phase shifter 25 to inject a small amount of the resistive component, highly accurate results have been obtained with a test coil having characteristics as above described.

It will be understood that a particular circuit arrangement, a particular type of test coil and particular values for components of the linearization circuit are set forth only for the purpose of illustrative example and are not to be construed as limitations. It will be understood that different types of circuits may be used. For example, the linearization circuit may be of a type operating with a power series approximation. There is also the possibility of incorporating feedback means to increase current in the test coil circuit as a function of increasing impedance to obtain linearization or to more closely approximate a linear condition, so as to reduce the requirements with respect to the linearization circuit and to increase accuracy. In addition, the characteristics of the test coil and the frequency of operation can be selected and adjusted to obtain more accurate measurement. More or less conventional methods of lift-off compensation may also be used by selecting proper phase compensation.

From a production standpoint, of course, it is desirable to use test coils and other components which can be readily and inexpensively duplicated with respect to characteristics and values, to permit highly accurate measurements while minimizing the number of final adjustments required. It is noted, in this connection, that the circuits of the illustrated instruments are relatively simple and straight-forward in design and are such to permit high accuracy in production.

It will be understood that other modifications and variations may be effected without departing from the spirit and scope of the novel concepts of this invention.

I claim as my invention:

1. In an eddy current instrument for measuring conductivity over a wide range of conductivity values, a test coil circuit including test coil means arranged to be placed in proximity to a part under test, an AC signal source coupled to said test coil circuit for applying thereto an AC signal of a certain frequency, said test coil circuit being operative to develop an AC output signal having an amplitude and a phase shift relative to said applied AC signal both varying as functions of the conductivity of the part under test, means coupled to said AC signal source for supplying a reference AC signal having a certain phase relation to said applied AC signal, a detector circuit responsive to said AC output signal from said test coil circuit and said reference AC signal for developing an analog signal, said detector circuit and said certain phase relation of said reference AC signal to said applied AC signal being such that the amplitude of said analog signal developed by said detector circuit changes as a non-linear function of conductivity of the part under test while changing progressively and continuously in one direction in response to changes in conductivity of the part under test from one end to the other of said wide range of conductivity values to thereby be a single-valued non-linear function of conductivity, a linearization circuit responsive to said analog signal from said detector circuit for developing an analog output signal varying as a linear function of the conductivity of the part under test, and digital read-out means responsive to said analog output signal of said linearization circuit to provide a digital indication of the conductivity of the part under test.

2. In an instrument as defined in claim 1, said detector circuit being a phase detector circuit having a first input responsive to said output AC signal of said test coil circuit and a second input responsive to said reference AC signal, and said reference AC signal being substantially in quadrature phase relation to said applied AC signal so that said analog signal developed by said phase detector circuit is substantially proportional to said inductive component of said output AC signal of said test coil circuit.

3. In an instrument as defined in claim 1, said detector circuit being a phase-to-voltage detector having a first input responsive to said output AC signal of said test coil circuit and a second input responsive to said reference AC signal and being operative to develop an analog signal substantially proportional to differences in phase between said output AC signal and said reference AC signal.

4. In an instrument as defined in claim 1, said linearization circuit comprising analog-to-digital converter means for responding to said analog signal from said detector circuit to develop first digital signals corresponding thereto, and memory circuit means for converting said first digital signals to second digital signals having a linear relationship to the conductivity of the part.

5. In an eddy current instrument for measuring conductivity over a wide range of conductivity values, a test coil circuit including test coil means arranged to be placed in proximity to a part under test, an AC signal source coupled to said test coil circuit for applying thereto an AC signal of a certain frequency, said test coil circuit being operative to develop an AC output signal having an amplitude and a phase shift relative to said applied AC signal both varying as functions of the conductivity of the part under test, means including a detector circuit responsive to said AC output signal for developing an analog signal varying as a non-linear single-valued function of the conductivity of the part under test, a linearization circuit responsive to said analog signal from said detector circuit for developing an analog output signal varying as a linear function of the conductivity of the part under test, and digital read-out means responsive to said analog output signal of said linearization circuit to provide a digital indication of the conductivity of the part under test, said test coil circuit including impedance means connected in series with said test coil means to form a series circuit to which said AC signal from said source is applied, the impedance of said impedance means being large in relation to the impedance of said test coil means, said test coil circuit further including reference coil means having characteristics substantially like the characteristics of said test coil means when said test coil means is away from a part, and second impedance means connected in series with said reference coil means to form a second series circuit to which said AC signal from said source is applied, the impedance of said second impedance means being substantially the same as that of the first impedance means the AC output signal of said test coil circuit being the difference between the signals across said test and reference coil means.

6. In an eddy current instrument for measuring conductivity over a wide range of conductivity values, a test coil circuit including test coil means arranged to be placed in proximity to a part under test, an AC signal source coupled to said test coil circuit for applying thereto an AC signal of a certain frequency, said test coil circuit being operative to develop an AC output signal having an amplitude and a phase shift relative to said applied AC signal both varying as functions of the conductivity of the part under test, means including a detector circuit responsive to said AC output signal for developing an analog signal varying as a non-linear single-valued function of the conductivity of the part under test, a linearization circuit responsive to said analog signal from said detector circuit for developing an analog output signal varying as a linear function of the conductivity of the part under test, and digital read-out means responsive to said analog output signal of said linearization circuit to provide a digital indication of the conductivity of the part under test, said linearization circuit comprising means for responding to said analog signal developed by said detector circuit to develop in progressive contiguous amplitude ranges of said analog signal a plurality of analog signal components according to different functions of said analog voltage, and means for combining said analog signal components to produce said analog output signal of said linearization circuit.

7. In an instrument as defined in claim 6, said linearization circuit comprising a DC voltage source, a plurality of resistance voltage divider circuits connected across said voltage source to provide different voltages respectively corresponding to break points at junctions between said contiguous amplitude ranges, and unidirectional conduction means connected to said resistance voltage divider circuits for developing said analog output signal of said linearization circuit.

* * * * *